United States Patent
Davis et al.

(10) Patent No.: US 6,172,873 B1
(45) Date of Patent: Jan. 9, 2001

(54) MULTI-ELECTRONIC MODULE MOUNTING AND RETENTION MECHANISM

(75) Inventors: David R. Davis, Sioux City, IA (US); Vernon Erickson, Vermillion; John Schindler, North Sioux City, both of SD (US)

(73) Assignee: Gateway Inc., North Sioux City, SD (US)

(*) Notice: Under 35 U.S.C. 154(b), the term of this patent shall be extended for 0 days.

(21) Appl. No.: 09/164,280

(22) Filed: Oct. 1, 1998

(51) Int. Cl.[7] ...................................................... H05K 7/20
(52) U.S. Cl. .......................... 361/716; 248/27.1; 361/719
(58) Field of Search ............................... 248/222.11, 632, 248/634, 638, 27.1, 455; 439/212, 377, 718; 361/690, 692, 704–707, 715, 716, 717–719, 796, 801, 807, 809, 810, 803; 165/185, 80.3; 454/184

(56) References Cited

U.S. PATENT DOCUMENTS

| | | | |
|---|---|---|---|
| 4,002,381 | * | 1/1977 | Wagner . |
| 4,048,669 | * | 9/1977 | Bowler . |
| 4,503,484 | * | 3/1985 | Moxon . |
| 4,546,407 | * | 10/1985 | Benenati . |
| 5,642,263 | * | 6/1997 | Lauruhn . |
| 5,731,956 | * | 3/1998 | Nocolici . |
| 5,943,218 | * | 8/1999 | Liu . |
| 5,966,289 | * | 10/1999 | Hastings . |

* cited by examiner

Primary Examiner—Gerald Tolin
(74) Attorney, Agent, or Firm—Laurence R. Letson

(57) ABSTRACT

A pair of risers are mounted on a mother or circuit board and trap one or two electronic circuit modules in an upstanding disposition and a bridging member extends between the risers. The bridging member forms a channel on its underside which engages a rail on a heat sink on one surface of the electronic module. The trappings of the rail by the bridging member positively restrains the module against movement away from the circuit board.

14 Claims, 4 Drawing Sheets

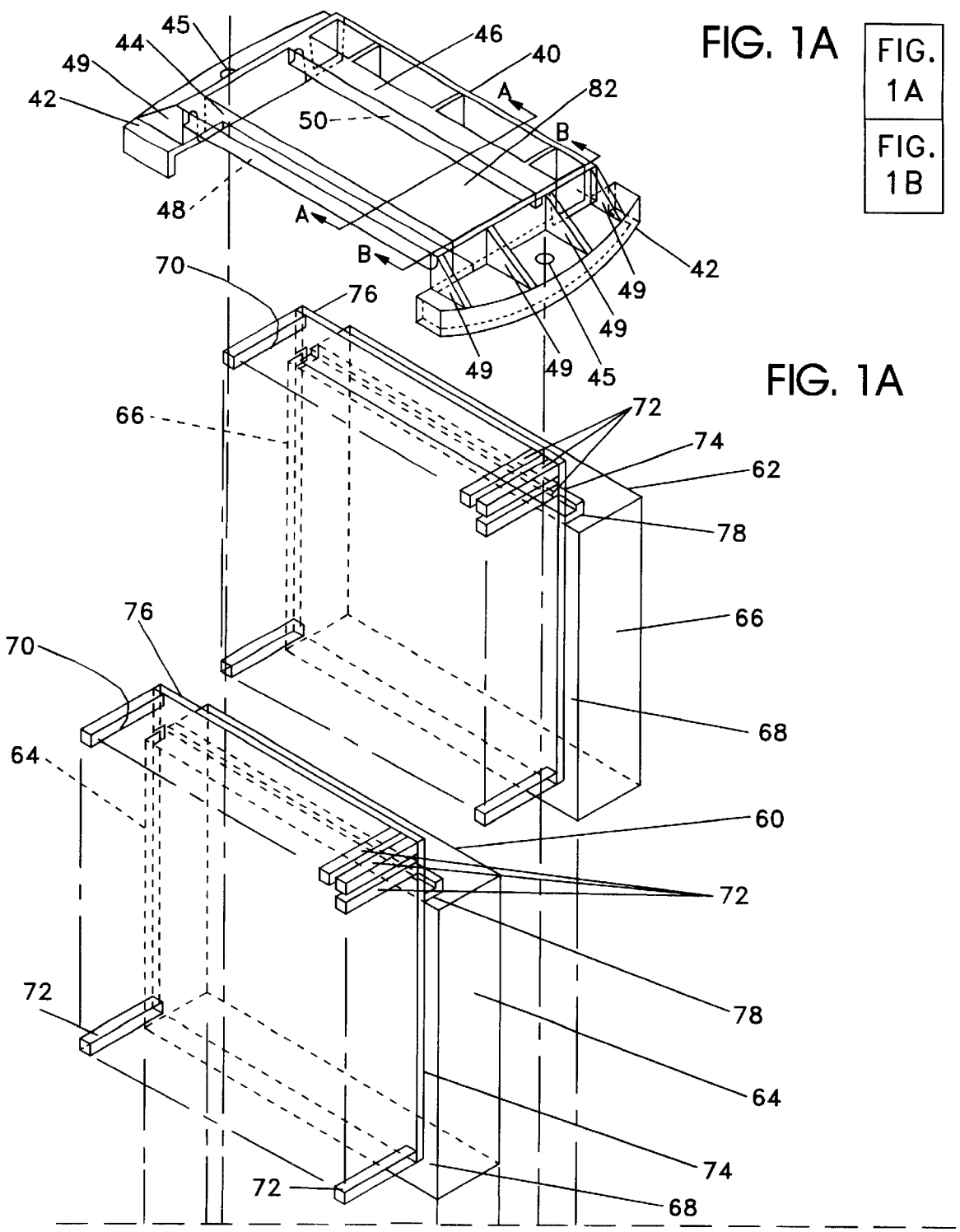

MULTI-ELECTRONIC MODULE MOUNTING AND RETENTION MECHANISM

FIELD OF INVENTION

This invention relates to a device for securely mounting, stabilizing and retaining multiple electronic modules on a circuit board and, more specifically, to a mounting mechanism attachable to the circuit board which traps and holds the electronic modules on the circuit board and thus prevents movement of the electronic modules relative to the circuit board, insuring maintenance of circuit connections between the electronic modules and the circuit board.

BACKGROUND

Newer microprocessors, such as those used in personal computers, are being integrated, along with memory and other closely related circuits, into an integrated electronic module. Of necessity, as additional circuits are integrated into the electronic module, the size and mass of the module has increased to the point that it is desirable to edge mount the module to the circuit board in order to conserve space on the circuit board as well as to enhance cooling.

Increased usage of parcel shipping services rather than the traditional freight methods of the past for the delivery of the product to the customer has increased the impact and handling stresses on a computer. This is particularly so on unsupported electronic components which otherwise would rely only on their electrical connections for support and attachment.

While an increase in mass of circuit components is not an inherent problem to the operation of the computer, not only does the larger mass create a higher risk of breakage during shipment of the computer, but also the larger number of electronic circuits integrated into electronic modules creates significant operational heat that must be dissipated. The heat dissipation requires a significant additional mass of a heat sink and/or heat radiator, such as fins or pins, to be attached to the body of the electronic module.

Additionally, with the increase in microprocessor speed which has occurred in the recent past and the integration of the additional circuits along with the microprocessor into electronic modules, any heat generated with usage of electricity within the electronic module requires dissipation at a maximum rate in order to maintain the operating temperature of the electronic module within proper ranges. This typically is accomplished by attaching a heat sink to the electronic module to absorb the heat and to provide a large surface area to transfer the heat to the air circulated over the heat sink. This added mass of the heat sink exacerbates the attachment and retention problems created by shipping and handling of the computer.

It is not practical to increase the bonding surface area of the solder connections between the electronic module and the circuit board to provide adequate strength to insure adequate and stable attachment as well as circuit continuity.

OBJECTS OF THE INVENTION

It is an object of the invention to securely mount and retain electronic modules on a circuit board.

It is another object of the invention to reduce shipping and handling stresses on electronic modules and particularly their attachment points to the circuit boards.

It is another object to stabilize the electronic modules to resist acceleration and deceleration forces occurring during drops and handling.

It is a further object to accommodate substantial heat sinks associated with and attached to electronic modules whenever rigidifying the connection of the electronic modules with the circuit board.

SUMMARY OF THE INVENTION

Electronic modules are mounted on their edges to a circuit board, disposed projecting upwardly. The edge connection points or pads, soldered to the circuit board connection points or pads, hold the electronic module in the desired orientation relative to the circuit board. A pair of risers fabricated preferably of a low cost material, such as high strength plastic, is mounted on the circuit board to capture and stabilize the electronic module in its desired orientation. The risers may be fitted and attached to the circuit board and the electronic modules after the circuit board is populated.

A heat sink may be mounted on one of the large flat surfaces of the electronic modules, and extended between the module edges engaged by the risers. If desired, the heat sink may extend beyond one edge of the electronic module, such as the top edge to enhance heat dissipation.

The heat sink typically is an aluminum extrusion formed as a flat plate having fins extending from one face of the plate in order to dissipate heat to the surrounding air. The fins may be continuous or, preferably, may be spikes or pins formed by cutting the fins in a direction orthogonal to the plane of each fin, thereby leaving a larger member of upstanding shafts or pins, typically of square or rectangular cross-section.

Due to the thermal expansion and contraction of the electronic module as it heats and cools with use and with an intent to isolate the electronic module from significant externally induced forces and stresses on the electronic module, the heat sink may be attached to the electronic module using a heat conductive adhesive. The adhesive attaches the heat sink and the electric module while accommodating any mismatch of thermal expansion between the electronic module and the heat sink. This arrangement permits the heat sink, having been extruded, to have a retaining rail formed on a planar surface of the flat plate portion and then subsequently use to the rail as a retaining structure for engagement by the mounting device.

The mounting device, made up of risers attached to the circuit board and a bridge member, forms a three-sided frame which stabilizes and constrains the electronic module relative to the circuit board. The constraint of the risers is provided by the channels in the risers engaging the side edges and a small portion of the front and back surfaces of the electronic modules. The bridge is provided with a mating groove or surface that engages or mates with the rail on the heat sink surface opposite the surface supporting the heat dissipation pins. The retaining force exerted on the heat sink and thus the electronic module is supplied by the bridge in order to insure the heat sink and electronic module do not move or rotate relative to the circuit board.

The mounting and retention mechanism retains as well as stabilizes the electronic module in its preferred orientation relative to the circuit board and further helps to insure that electrical continuity between contacts on the circuit board and contacts on the electric module is maintained.

A better and more complete understanding of the invention may be garnered from the attached drawings and the following Detailed Description of the Drawings.

DRAWINGS

FIG. 1, composed of FIGS. 1A and 1B, is an exploded view of the retention mechanism and electronic modules with heat sinks attached to the electronic modules.

DETAILED DESCRIPTION OF THE BEST MODE OF THE PREFERRED EMBODIMENT OF THE INVENTION

Figure 1B:
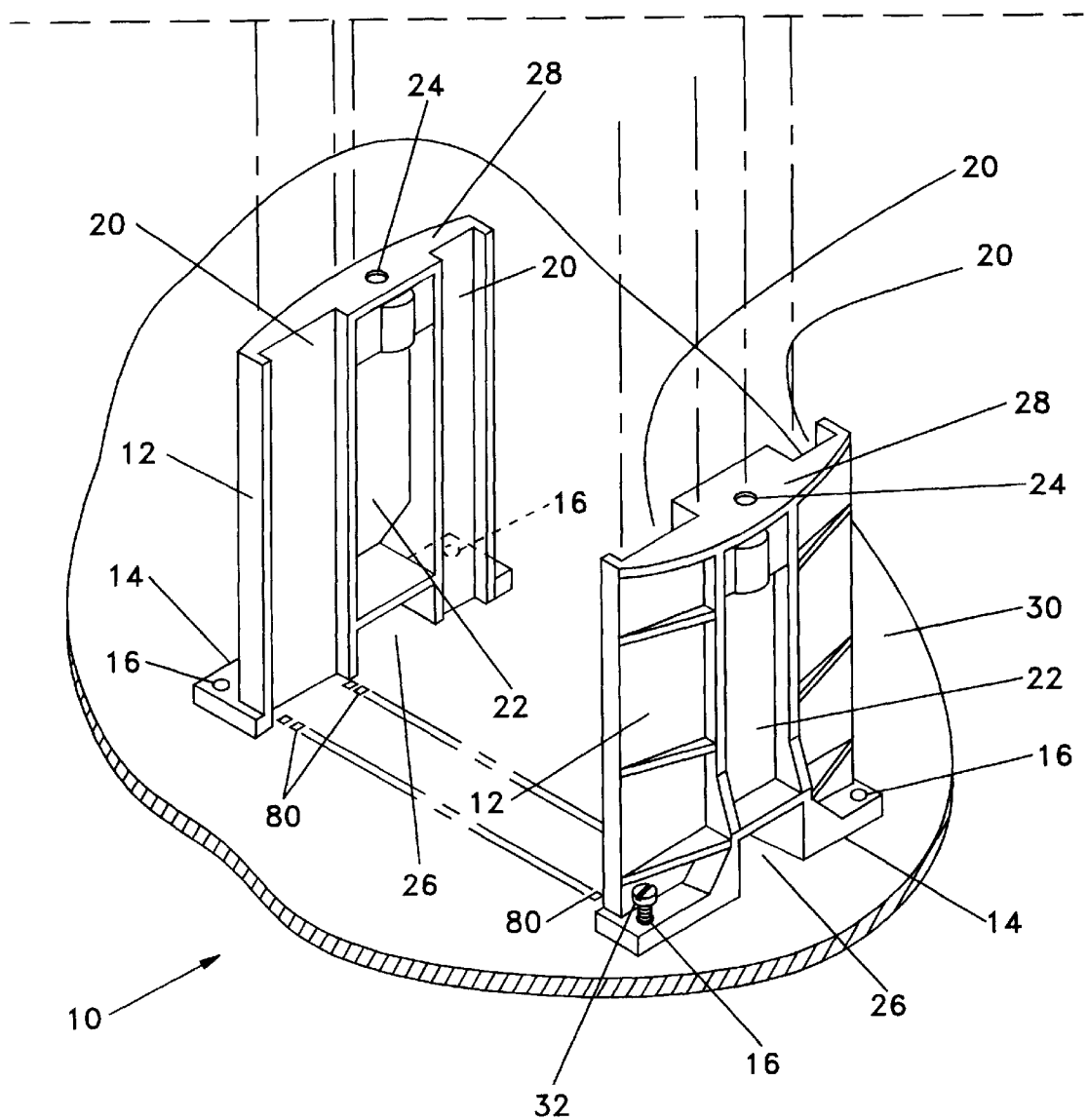
Figure 2:
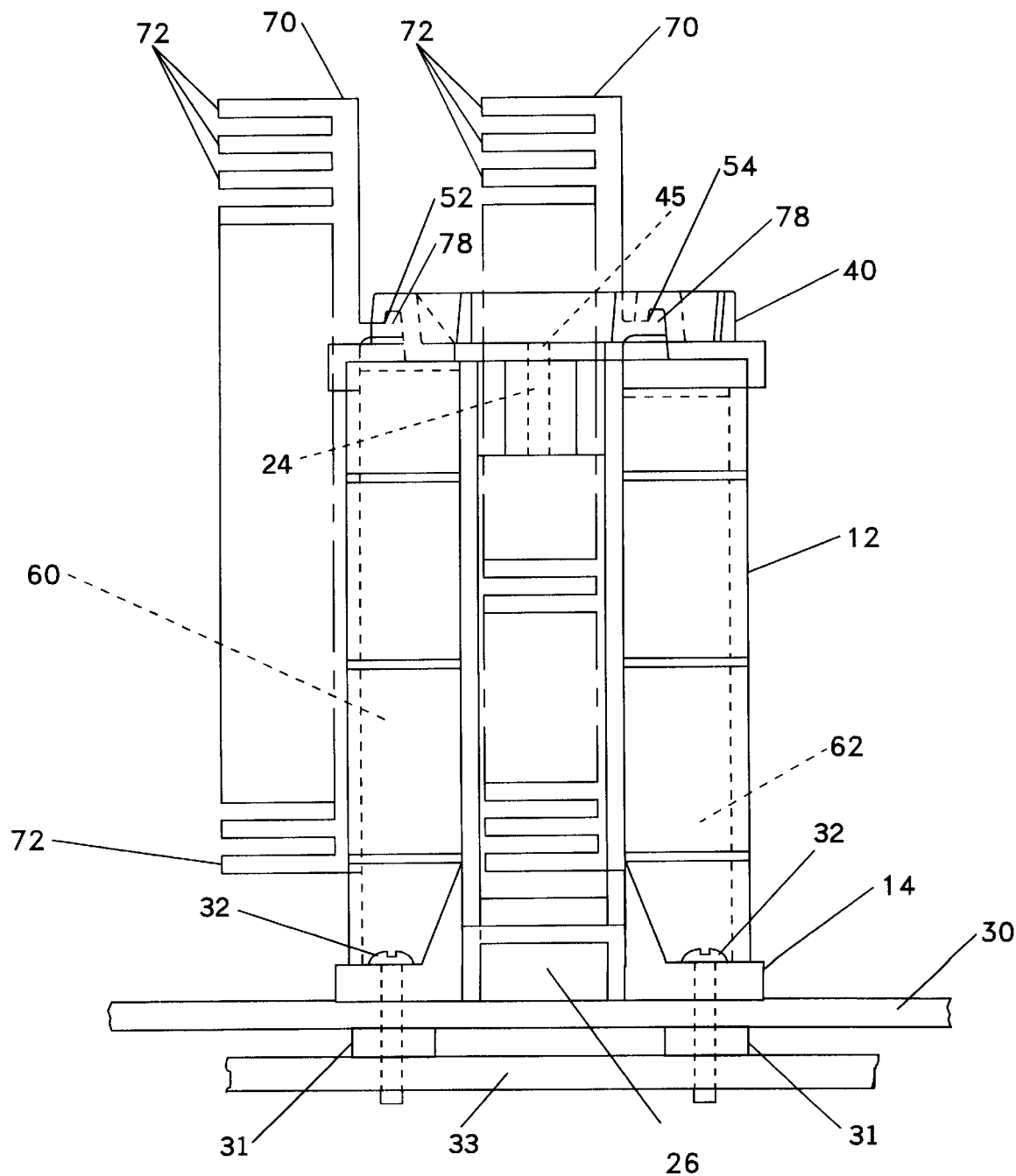
FIG. 2 is an end-view of the retention mechanism with the electronic modules and heat sinks assembled to the circuit boards.

Referring to FIG. 1, and particularly FIG. 1B, a first pair of riser supports 12 or risers 12 of retention mechanism 10 are each shown with a widened base 14 having mounting holes 16, one of which is hidden from view. Each upstanding riser 12 is formed to define a pair of open-ended channels 20. The channels 20 extend the entire height of riser 12 and are spaced apart to provide substantial spacing therebetween, and riser 12 is further formed to provide an opening 22 or passage 22 through the riser 12, intermediate channels 20.

Opening 22 through riser 12 serves as an air passage into the region between channels 20. The opening 22 should occupy as much of the space between the channels 20 as possible for maximum air flow consistent with the riser 12 retaining stability and integrity. The riser 12 is further provided with a screw hole 24 in its top end surface 28. This screw hole 24 is used to attach the bridge member 40 to risers 12, to retain electronic module 60, 62, FIG. 1A with risers 12.

Referring now to FIGS. 1A and 1B, the base 14 of riser 12 is preferably further provided with a channel 26 formed to permit passage of additional air or electrical conductors from outside the risers 12 to the region between the risers 12.

Risers 12 are typically attached by screws 32 to a printed circuit board 30 on which electrical and electronic components and electronic modules may be populated. In this particular instance, the circuit board 30 is a main system board of a computer, also commonly referred to as a mother board 30. The circuit board 30 is illustrated in broken-away form to leave a fragment to which the risers 12 may be mounted by screws 32 or other attaching technique, such as rivets or bolts. The screws 32 or bolts may advantageously be extended through mother board 30 and standoffs 31 to threadedly engage computer system unit frame or chassis 33 for additional strength or stability over and above that provided by the mother board 30

To complete the retention mechanism 10, the risers 12 are spanned by a bridge member 40 which is provided with mounting caps 42. Mounting caps 42 seat over top end surfaces 28 of risers 12, and have screw or attachment holes 45 which align with screw holes 24. Bridge member 40 has two bridging beams 44, 46 extending between mounting caps 42 and is further strengthened by stringers 49.

Figure 3:
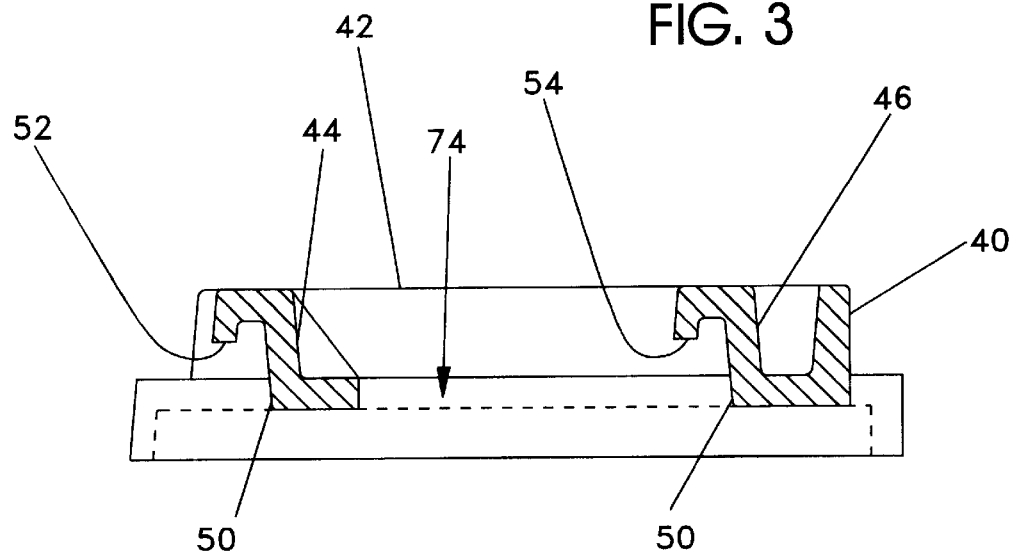
FIG. 3 is a section-view of the bridge member taken along A—A in FIG. 1.

The bridging beams 44 and 46 both have a retaining function. The configuration of the bridging beams 44, 46 is such that undersides 48, 50 of beams 44, 46 are formed in a hook shaped cross-section. The fully developed surface over the length of the bridging beams 44, 46 form a hook shaped ridge 52, 54, best viewed in section format in FIG. 3.

The assembled risers 12 and bridging member 40 are arranged partially surrounding electronic modules 60, 62, which are arranged to be and are electrically connected to mother board 30 by conventionally soldered connections (not shown). The risers 12 engage and enclose the two narrow opposed side surfaces 64, 66 of the electronic modules 60, 62, respectively. The narrow side surfaces 64, 66 fit within channels 20 of risers 12. The electronic modules 60, 62 each carry on one large planar surface 68 thereof a heat sink 70. The heat sink 70 is formed of a highly heat conductive metal, such as aluminum. The heat sink 70 may be made by extruding aluminum with a plurality of fins extending from one planar surface of a plate 74. The fins may be subsequently cut orthogonally down to the plate 74 to produce a large plurality of fins or pins 72 extending from the plate 74 of heat sink 70. A configuration of pins 72 is a advantageous for cooling due to the large surface area thereon and due to the increased air flow passages available between the pins 72.

On the other side 76 of plate 74, opposite the side supporting pins 72, is an outwardly extending rail 78, similarly formed by extrusion. The shape of rail 78 is preferably complementary to the hook shaped ridges 52 or 54 of bridge 40, best viewed in FIG. 3. The hook shaped ridge 52 or 54 is disposable to hookingly engage rail 78, thereby retaining the heat sink 70 against any forces attempting to move rail 78, heat sink 70 and electronic module 60 and 62 relative to circuit board 30. A heat sink 70 is fixed to each electronic module 60, 62 by a heat conductive adhesive or similar material to conduct heat from the electronic module 60 or 62 to heat sink 70 and pins 72, thereby enhancing conductive, convective or radiative dissipation.

Due to the relatively rigid attachment of heat sinks 70 to the electronics module 60, 62 the engagement of the bridge member 40 with rail 78 stabilizes heat sinks 70 and electronic modules 60, 62 relative to the mother board 30. The engagement between the rail 78 and hook shaped ridges 52, 54 of bridge members 40, 42 in addition to the engagement of the edges and some portions of the front and back surfaces of electronic modules 60, 62 by risers 12 prevents the heat sink 70/electronic module 60 assembly from moving relative to mother board 30 and thus protects the electrical connections between mother board 30 and electronic modules 60, 62.

Figure 4:
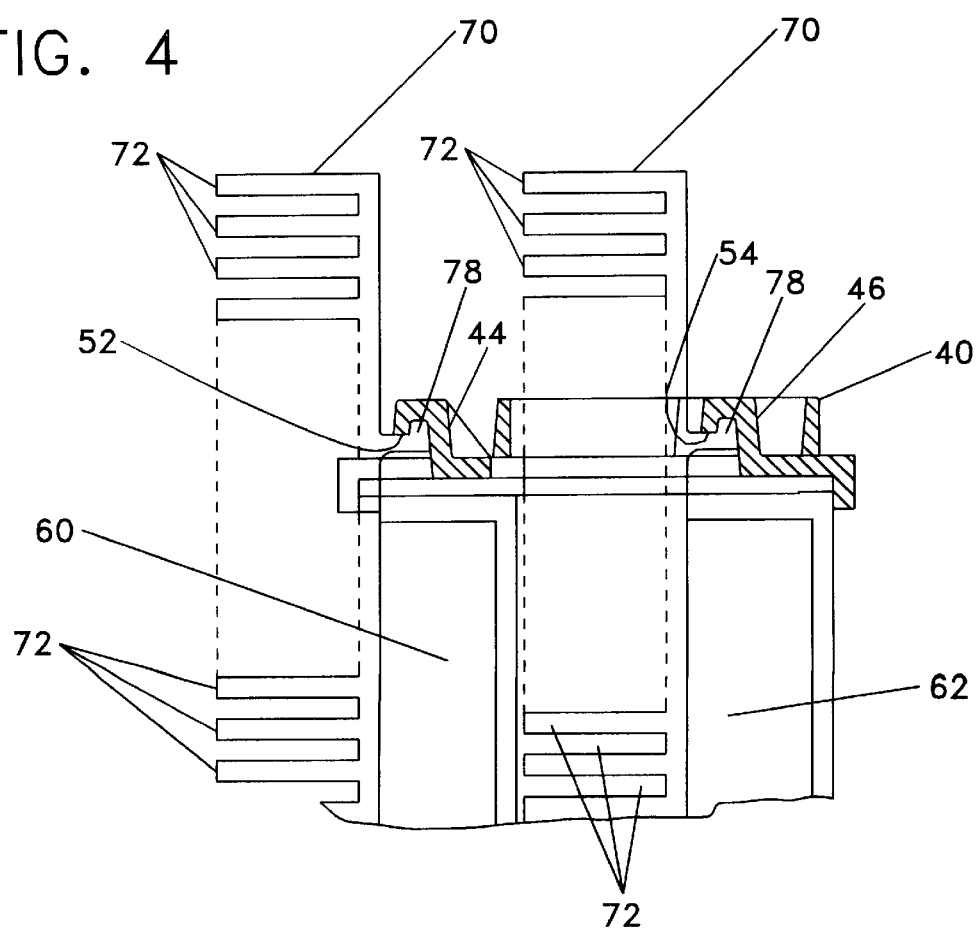
FIG. 4 shows a partially assembled bridge member mounting device, electronic modules and heat sink, in section, taken along B—B in FIG. 1.

Opening 82 defined by bridging beams 44, 46 and caps 42 permit the extension of the heat sink 70 therethrough and the passage of cooling air past and over the pins 72 of heat sink 70 as seen in FIG. 4.

The relatively wide bases 14 of risers 12 provide stability and resistance to acceleration/deceleration forces relative to the mother board 30, thereby protecting the electrical connections 80 between the electronic modules 60 and the mother board 30.

The retention mechanism 10 is preferably comprised of risers 12 and bridging member 40 assembled to the mother board 30 after the electronic modules 60, 62 have been solder connected and mounted to the mother board 30. The risers 12 are positioned relative to electronic modules 60 and screwed, bolted or riveted to the mother board 30. The bridge member 40 is positioned over the heat sinks and onto the top end surfaces 28 of risers 12 and a screw, bolt or rivet, not shown, fastened in holes 45 and 24 to rigidly attach bridge member 40 to risers 12. In so doing, bridge member 40 engages and traps rail 78 on each heat sink 70 to fix and stabilize heat sink 70 and electronic module 60 or 62 relative to the mother board 30.

When assembled, the retention structure 10 comprised of risers 12 and bridge member 40 substantially protects the electronic modules 60, 62 from being bent over or breaking soldered connections to the motherboard 30 during handling and shipping.

The risers 12 and bridging member 40, components of the retention device 10, may be advantageously made by injection molding high strength reinforced plastic. The details of the reinforcing stringers 49 may be determined by a skilled plastics artisan.

The profile of rail 78 is not critical so long as the mating surface of the bridging members 44, 46 mate therewith and capture the respective rail 78 and constrain it against movement.

One skilled in the art will appreciate that specific details of the multiple module retention device 10 may be altered in minor or insubstantial ways without removing the resulting assembly from the protection afforded by the appended claims.

We claim:

1. A module mounting assembly mounting modules on a circuit board, comprising:

A pair of riser members, each having a base in engagement with said circuit board;

a bridge member bridging between said riser members;

said riser members each comprising a pair of channels formed into faces thereof and which accept into each one of said channels on each of said riser members one edge of a singe module;

said bridge member disposed on a distal end of each said riser member spaced apart from said base, and said bridge member further blocking removal of said module from said channels;

said riser members further comprising air flow apertures disposed in each of said riser members said apertures disposed intermediate said channels, forming an air flow passage between said modules;

said bridge further defining an aperture accepting insertion of an extension of said module therethrough and encircling a portion of said module.

2. The module mounting assembly of claim 1 wherein said bridge member further defines an aperture communicating with said air flow passage.

3. The module mounting assembly of claim 2 wherein said bridge member further comprises an engagement groove associated with and disposed relative to said module and engaging and retaining engagement surfaces associated with said modules, thereby insuring retention of said module and maintaining continued electrical continuity between said module and said circuit board.

4. The module mounting assembly of claim 1 further comprising holes in said base receiving an attachment member extending therethrough and engaging said circuit board and for attachment to a case containing said circuit board and said module.

5. The module mounting assembly of claim 3 further comprising holes in said base receiving an attachment member extending therethrough and engaging said circuit board and for attachment to a case containing said circuit board and said module.

6. The module mounting assembly of claim 4 wherein said riser members and said bridge comprise aligned holes with attachment members extending therethrough to attach said bridge member to said distal ends of said riser members.

7. The module mounting assembly of claim 5 wherein said riser members and said bridge comprise aligned holes for passage of attachment members extending therethrough to attach said bridge member to said distal ends of said riser members.

8. A module mounting assembly mounting and stabilizing modules on a circuit board, comprising:

a pair of riser members each having a base in engagement with said circuit board;

a bridge member bridging between said riser members;

said riser members each comprising a pair of channels formed into faces thereof and which accept into each one of said channels on each of said riser members one edge of a single module;

said bridge member disposed on an end of each riser member distal from said base and further blocking movement of said module from said channels;

each of said riser members having at least one aperture for air flow disposed intermediate said channels and extending through said riser member, forming an air flow passage between said modules;

said bridge member further defining an aperture communicating with said air flow passage, said aperture aligned with and accepting a heat sink, whereby air may pass between said modules to cool said modules.

9. The module mounting assembly of claim 8 wherein said bridge member further comprises an engagement surface disposed relative to said module positions engaging and retaining an engagement surface of said heat sink attached to said module thereby insuring retention of said module therein and continued electrical continuity between said module and said circuit board.

10. The module mounting assembly of claim 9 wherein said engagement surface of said bridge comprises a groove formed in said bridge.

11. The module mounting assembly of claim 8 further comprising holes in said base for receiving an attachment member extending therethrough and engaging said circuit board.

12. The module mounting assembly of claims 9 further comprising holes in said base receiving an attachment member extending therethrough and engaging said circuit board.

13. The module mounting assembly of claims 9 wherein said riser members and said bridge comprise aligned holes with attachment members extending therethrough to attach said bridge member to said distal ends of said riser members.

14. The module mounting assembly of claim 10 wherein said riser members and said bridge comprise aligned holes with attachment members extending therethrough to attach said bridge member to said distal ends of said riser members.

* * * * *